United States Patent
Ngo et al.

(10) Patent No.: US 6,281,584 B1
(45) Date of Patent: Aug. 28, 2001

(54) INTEGRATED CIRCUIT WITH IMPROVED ADHESION BETWEEN INTERFACES OF CONDUCTIVE AND DIELECTRIC SURFACES

(75) Inventors: Minh Van Ngo, Fremont; Richard J. Huang, Cupertino; Guarionex Morales, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/373,482

(22) Filed: Aug. 12, 1999

Related U.S. Application Data

(63) Continuation-in-part of application No. 09/203,572, filed on Dec. 2, 1998, now Pat. No. 6,252,303.

(51) Int. Cl.[7] .......................... H01L 23/48; H01L 23/52; H01L 29/40
(52) U.S. Cl. .......................... 257/758; 257/750; 257/751; 257/763; 257/764
(58) Field of Search ................................. 257/758, 750, 257/751, 763, 764, 774, 649

(56) References Cited

U.S. PATENT DOCUMENTS

| | | | |
|---|---|---|---|
| 5,872,402 | * 2/1999 | Hasegawa | 257/758 |
| 5,946,601 | * 8/1999 | Wong et al. | 438/783 |
| 5,989,983 | * 11/1999 | Goo et al. | 438/473 |
| 6,043,145 | * 3/2000 | Suzuki et al. | 438/622 |

FOREIGN PATENT DOCUMENTS

| | | |
|---|---|---|
| 8-203890 | * 8/1996 | (JP) . |
| 10-275859 | * 10/1998 | (JP) . |
| 11-40669 | * 2/1999 | (JP) . |

* cited by examiner

Primary Examiner—Jhihan B Clark
(74) Attorney, Agent, or Firm—Foley & Lardner

(57) ABSTRACT

A method for using low dielectric SiOF in a process to manufacture semiconductor products, comprising the steps of obtaining a layer of SiOF, and depleting fluorine from a surface of the SiOF layer. In a preferred embodiment, the depleting step comprises the step of treating the surface of the layer of SiOF with a plasma containing ammonia. It is further preferred that the treated surface be passivated by a nitrite plasma. The invention also encompasses a semiconductor chip comprising an integrated circuit with at least a first and second layers, and with a dielective layer of SiOF disposed between the layers, wherein the SiOF dielectric layer includes a first region at one edge thereof which is depleted of fluorine to a predetermined depth.

20 Claims, 4 Drawing Sheets

INTEGRATED CIRCUIT WITH IMPROVED ADHESION BETWEEN INTERFACES OF CONDUCTIVE AND DIELECTRIC SURFACES

CROSS REFERENCE TO RELATED APPLICATIONS

The present application is a continuation-in-part of U.S. patent application Ser. No. 09/203,572 filed on Dec. 2, 1998 now U.S. Pat. No. 6,252,303 by Huang. The present application is also related to U.S. patent application Ser. No. 09/157,240, entitled "Surface Treatment of Low-K SiOF to Prevent Metal Interaction", filed on an even date herewith by Ngo, et al. Both applications are assigned to the assignee of the present application.

BACKGROUND OF THE INVENTION

1. Field of the Invention

The present invention relates generally to the field of semiconductor chip processing or integrated circuit (IC) fabrication. More particularly, the present invention is related to an interlayer dielectric and the processing steps associated with the interlayer dielectric.

2. Description of the Related Art

Integrated circuits (ICs) often include a number of conductive or metal layers separated by insulative or dielectric layers. The metal layers are generally provided over an insulative layer (ILDO) that covers transistors disposed in a substrate. Each metal layer or stack generally is a composition of several conductive materials, such as, tantalum (Ta), copper (Cu), aluminum (Al), titanium (Ti), tungsten (W), and compounds of copper, tantalum, aluminum, tungsten, nitrogen (N), and titanium. The dielectric layers are generally silicon dioxide ($SiO_2$) and are often referred to as interlayer dielectrics or interlevel insulators. The interlayer dielectrics electrically isolate metal layers from each other (e.g., a metal 1 layer from a metal 2 layer).

The interlayer dielectric is typically deposited as silicon dioxide in a chemical vapor deposition (CVD) process. For example, the interlayer dielectric can be provided over a metal layer in a tetraorthosilicate (TEOS) process. After the interlayer dielectric is planarized, a metal layer is provided over the interlayer dielectric.

Generally, it is desirable to reduce the capacitance associated with the metal layers in an IC. Reducing capacitance increases the speed of the IC and is a particularly important design goal as IC devices become smaller. One technique for reducing the capacitance associated with the metal layers is to reduce the dielectric constant associated with the interlayer dielectric (e.g., the insulating layer between metal layers).

Fluorinated silicon dioxide (SiOF) material can be used as the interlayer dielectric instead of silicon dioxide material to lower the capacitance associated with the metal layers. Fluorinated silicon dioxide has a lower dielectric constant than silicon dioxide. For example, fluorinated silicon dioxide has a dielectric constant in a range from 3.6 to 3.8, while silicon dioxide has a dielectric constant of 4.0 or more. Fluorinated silicon dioxide is typically provided by plasma enhanced chemical vapor deposition (PECVD) or a high density plasma (HDP) application technique. Therefore, utilizing fluorinated silicon dioxide can reduce the capacitance associated with the semiconductor device and thereby increase its speed and performance.

Fluorine atoms in fluorinated silicon dioxide can react with barrier metals (Ti, TiN, Ta, TaN, Al, Cu, etc) associated with the metal layers. The barrier metals are typically deposited (BMD) by plasma vapor deposition (PVD) or chemical vapor deposition (CVD) on the surface of the fluorinated silicon dioxide. For example, in an IC containing two metal layers, a barrier metal for the second metal layer is deposited on the interlayer dielectric which covers the first metal layer. The barrier metal layer is typically located on the bottom of the composite metal layer. The reaction between the fluorine and the barrier metal can cause delamination and other adhesion problems.

In addition, the reaction can cause delamination and adhesion problems inside vias (e.g., holes) which extend through the fluorinated silicon dioxide. Contacts or electrical connections between metal layers are made through vias in the interlayer dielectric. Delamination and adhesion problems can also exist at the interface between the titanium nitride layer and the fluorinated silicon dioxide layer. The titanium and titanium nitride layers are typically located at the top of the composite metal layers.

Thus, there is a need for an IC which is less susceptible to adhesion and delamination problems. Further still, there is a need for a method of manufacturing an IC that reduces adhesion and delamination problems associated with fluorinated silicon dioxide.

SUMMARY OF THE INVENTION

The present invention relates generally to an integrated circuit including a first metal stack, a second metal stack, and a fluorinated silicon dioxide material. The fluorinated silicon dioxide material is disposed between the first metal stack and second metal stack. The material has a surface that is depleted by a process that utilizes ammonia and is passivated in a process that utilizes nitrite.

The present invention further relates to an integrated circuit including a first conductive layer, a second conductive layer, and an insulative layer. The insulative layer includes fluorinated silicon dioxide. The insulative layer has a surface in contact with the second conductive layer. The surface is depleted of fluorine to a first depth and is passivated to a second depth. The second depth is less than the first depth. The surface is depleted by a process including ammonia, or the surface is passivated in a process including nitrite.

The present invention also relates generally to a method for fabricating an integrated circuit. The integrated circuit includes a first metal stack, a dielectric layer, and a second metal stack. The dielectric layer is between the first metal stack and the second metal stack. The method includes steps of providing the first metal stack, providing the dielectric layer as a layer of SiOF, depleting the fluorine from a surface of the layer of SiOF with a plasma including $NH_3$, and providing the second metal layer.

The present invention further relates to a method for using low dielectric constant SiOF in a process to manufacture semiconductor integrated circuits. The method includes steps of obtaining a layer of SiOF and treating the surface of the layer of SiOF with a plasma containing ammonia to deplete fluorine from the surface.

The present invention further still relates to a semiconductor chip. The semiconductor chip includes an integrated circuit with at least a first layer and a second layer. A dielectric layer of SiOF is disposed between the first layer and the second layer. The dielectric layer has a surface depleted of fluorine to a depth. The dielectric layer is depleted in an ammonia process.

The present invention even further relates to a method of forming metal layers in an integrated circuit. The method includes providing a first metal stack, providing a dielectric layer including fluorine, depleting the fluorine from an exposed surface of the dielectric layer with an ammonia treatment, and providing a second metal stack over the dielectric layer.

BRIEF DESCRIPTION OF THE DRAWINGS

The exemplary embodiments of present invention will hereafter be described with reference to the accompanying drawings, wherein like numerals denote like elements and.

DETAILED DESCRIPTION OF THE PREFERRED EMBODIMENT

The present invention will be described in its context of use with an interlayer dielectric layer in a conducting layer stack on a semiconductor chip. However, the invention has broad application in any situation where SiOF material is utilized as a layer.

Figure 1:
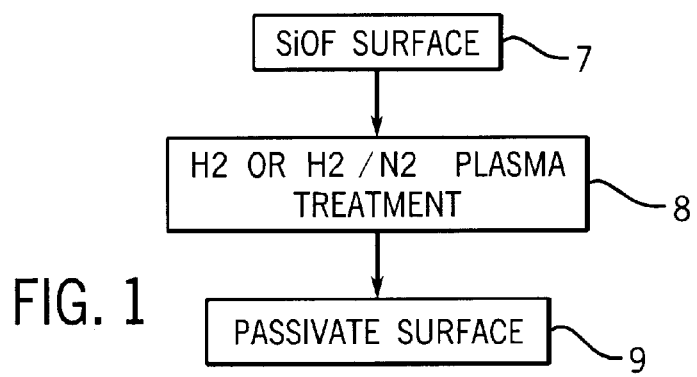
FIG. 1 is a process flow diagram for a method in accordance with an exemplary embodiment of the present invention.

Referring now to the drawings, FIG. 1 is a process flow diagram for a method in accordance with an embodiment the present invention. The method advantageously utilizes a depleting step 8, which treats the surface of the layer of SiOF resulting from a step 7 with a plasma containing hydrogen to yield a treated surface. The treating or depleting step 8 is carried out in a CVD deposition chamber, and the depleting step 8 forms a depletion layer that is preferably greater than or equal to 30 Å in thickness. The method can further advantageously include passivating the treated surface in a step 9. The passivating step 9 can apply substantially pure nitrogen plasma to the treated surface. The passivating step 9 comprises the step of forming a passivation layer that is preferably less than or equal to 25 Å in thickness. Preferably, the nitrogen plasma is applied at a lower plasma bias power and a higher pressure than the hydrogen-containing plasma used in the treating step 8.

Figure 2:
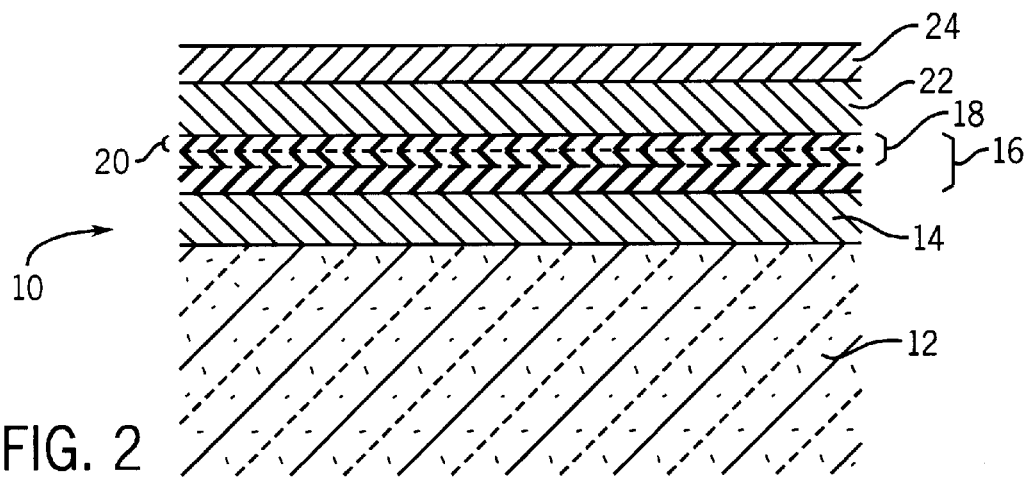
FIG. 2 is a cross-sectional view of a select group of layers on a semiconductor chip in accordance with an exemplary embodiment.

FIG. 2 illustrates a semiconductor chip 10 in accordance with the present invention comprising a bulk substrate and various process layers, designated generally by the numeral 12. A further layer 14 is then deposited. By way of example, this further layer 14 might be a composite or a single conducting layer, such as, a metallic layer. For purposes of describing the present invention, a fluorinated silicon dioxide (SiOF) layer 16 is shown as being deposited on layer 14 in a step 7 (FIG. 1). The SiOF layer 16 may be formed, by way of example, but not by way of limitation, by introducing a fluorine species during an $SiO_2$ PECVD or HDP. Typically, after SiOF deposition (step 7), vias are etched through the SiOF layer 16. This via etch step is followed by a resist strip step and a solvent clean step, in the well-known manner.

Process step 8 (FIG. 1) depletes the fluorine from the top surface of the SiOF layer 16 to yield a depleted region or layer 18 having a desired thickness. In a preferred embodiment, this thickness of the depleted layer 18 is equal to or greater than 30 Å.

In a preferred embodiment, step 8 (used to form the depletion layer 18) is accomplished by treating the surface of the SiOF layer 16 with a plasma containing hydrogen. For example, the plasma may be pure hydrogen, or it may be a diluted $H_2$ plasma, e.g., an $H_2/N_2$ plasma. The purpose of diluting the hydrogen plasma is to make the hydrogen less volatile. The hydrogen in the plasma will bond with the fluorine atoms to form HF, which, because of its high vapor pressure and low boiling point, will be vaporized and evacuated from the system.

In a preferred embodiment, the hydrogen plasma treatment (step 8) is performed in a CVD deposition chamber, such as, for example, an Applied Material CVD deposition chamber. The CVD chamber may be the same chamber used to deposit a subsequent conducting layer, such as, TiN. Preferably, the CVD chamber for the plasma treatment should have a slightly elevated temperature (5–50° C. higher) relative to the temperature used to deposit the subsequent conducting layer. For example, if a temperature falling in the range of 375° C. to 450° C. is to be used to deposit a subsequent conducting layer 22, then a slightly elevated temperature that is 5° C. to 50° C. higher than the conducting layer 22 CVD deposition temperature is used during the hydrogen plasma treatment step. The purpose for using this elevated temperature is to lower the probability that heating during the subsequent conducting layer deposition step may drive the fluorine atoms from the bulk SiOF layer 16 into the fluorine-depleted layer 18.

The other parameters for the hydrogen plasma treatment (step 8) will be determined empirically. Typically, the pressure in the CVD chamber will be in the millitorr to torr range; the energy parameter will be in the several hundred watt range, and the plasma treatment time will range from 20 seconds to several minutes. Optimized parameters will be determined based on the desired thickness of the depletion layer 18.

In a preferred embodiment, the depleted layer 18 is then passivated in a step 9 (FIG. 1) to form a passivation layer 20 that is less than the thickness of layer 18. One purpose of passivation step 9 is to bond non-volatile atoms into the depleted layer 18 to lessen the probability for fluorine atoms from the bulk SiOF layer 16 to diffuse up into the depleted layer 18 and, thereafter, to react with the conducting layer atoms of the subsequently deposited layer 22. Passivation step 9 may be carried out by switching to a pure $N_2$ plasma in the CVD chamber to form SiON to a thickness that is less than the thickness of the depleted layer 18. For example, the passivation layer 20 could have a thickness of 25 Å or less. Typically, a higher source power will be used in the CVD chamber, such as, 300–400 watts, to cause the nitrogen to bond with the $SiO_2$ surface to yield an SiON dielectric barrier. This passivated dielectric barrier layer lessens the probability that fluorine atoms will diffuse up to the surface of layer 16 and react with, for example, a Ti or TiN barrier metal.

Note that a lesser bias power (the bias power is different than the plasma power) and a higher pressure condition should be used to treat sidewalls and vias in the SiOF layer 16. For example, a bias power of less than 100 watts could be utilized. One purpose for the lower bias power is to make the plasma less directional so that it will affect the sidewalls.

The exact thickness of the passivation layer 20 may be optimized empirically. Note that a SIMS analysis may be performed to measure both the thickness of the depleted layer 18 and the thickness of the passivation layer 20. Ultimately, optimization is achieved when the depleted and passivation layer thicknesses are such that it can be assumed that the subsequent layer 22 will not peel off during the remaining processing steps for the semiconductor chip.

A typical device realized using the present invention method might have a bulk SiOF layer 16 of 8,000 to 15,000 Å, with a depleted layer 18 of 50 Å, and a passivation layer 20 of 25 Å.

Next, a conducting layer 22 is deposited. By way of example, an in-situ deposition of optimized CVD-TiN may be accomplished in the previously mentioned CVD chamber using a nitrogen-rich initial layer. Note that the present invention is not limited to TiN and TaN. A variety of metals are available to form these conducting layers, including Ti, Ta, Al, and Cu, for example. This deposition would then be followed by a standard blanket tungsten deposition to form a layer 24.

Figure 3:
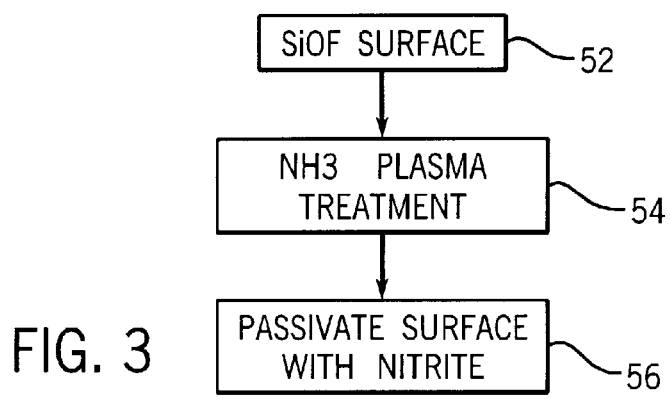
FIG. 3 is a process flow diagram for a method in accordance with another exemplary embodiment of the present invention.
Figure 4:
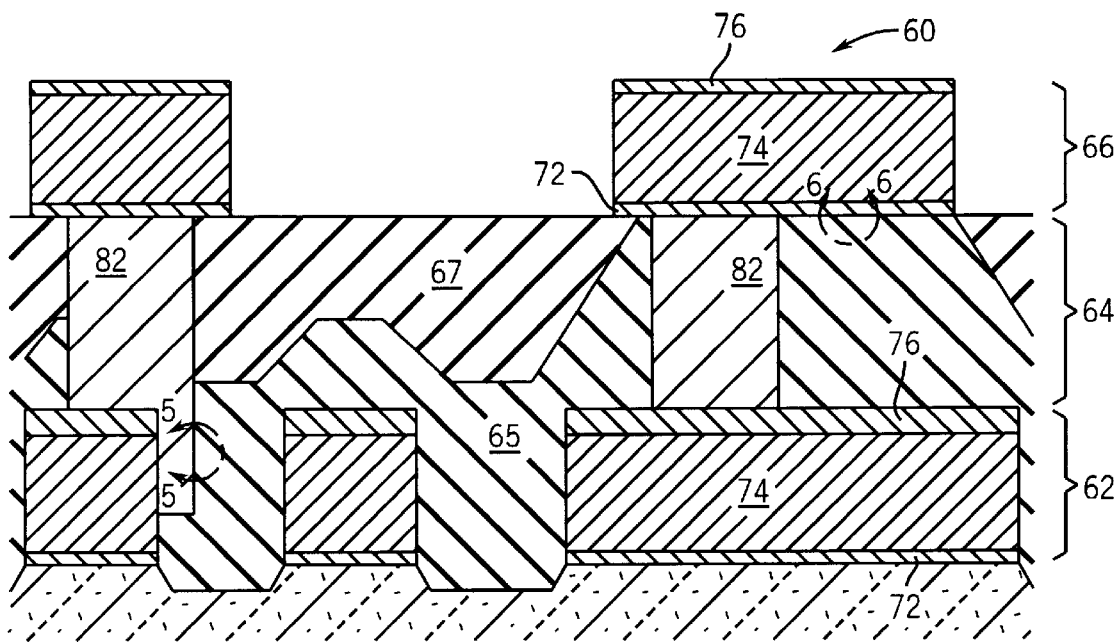
FIG. 4 is a cross-sectional view of an integrated circuit including an interlevel dielectric fabricated in accordance with the process illustrated in FIG. 3.

With reference to FIG. 3, a process flow diagram includes an SiOF providing step 52, an ammonia ($NH_3$) plasma treatment step 54 and a passivation step 56. The process flow diagram illustrated in FIG. 3 is a modified version of the process flow diagram discussed with reference to FIG. 1. Step 52 is similar to step 7, step 54 is similar to step 8, and step 56 is similar to step 9. With reference to FIG. 4, the process flow diagram in FIG. 3 can be utilized to manufacture an integrated circuit 60 having a metal layer 62, an interlevel dielectric layer 64, and a metal layer 66.

Metal layers 62 and 66 include a bottom layer 72, a middle layer 74, and a top layer 76. Layer 72 is preferably a 200–1500 Å thick barrier metal layer, including Ti, TiN, Ta, TaN, Al, Cu, or other conductor. Layer 72 can be a composite layer of Ti (500–150Å thick) and TiN (200–1000 Å) thick. Alternatively, layer 72 can be a 200–1000 Å thick TiN layer. Middle layer 74 is preferably a 4000–1000 Å thick aluminum layer or an alloy of aluminum, such as, an aluminum copper layer. Layer 76 is preferably a compound Ti/TiN layer or TiN layer similar to layer 72 thick titanium or titanium nitride layer.

In step 52, layer 64 is initially deposited as silicon dioxide on top of layer 76 of layer 62. The silicon dioxide is fluorinated to yield fluorinated silicon dioxide. Layer 64 preferably has a lower dielectric constant than silicon dioxide. Fluorine species can be introduced during $SiO_2$ PECVD or HDP. Layer 64 can be a 5000–10,000 Å thick layer of fluorinated silicon dioxide (SiOF). Alternatively, layer 64 can be a compound layer comprised of a SiOF layer 65 and a silicon dioxide layer ($SiO_2$) layer 67.

Figure 5:
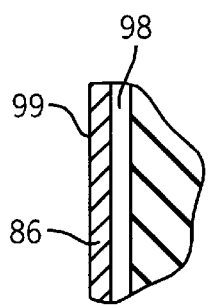
FIG. 5 is a more detailed cross-sectional view of a via hole in the integrated circuit illustrated in FIG. 4.
Figure 6:
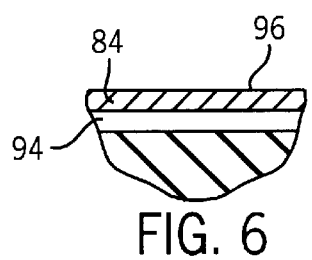
FIG. 6 is a more detailed cross-sectional view of a top surface of the interlayer dielectric illustrated in FIG. 4.
Figure 7:
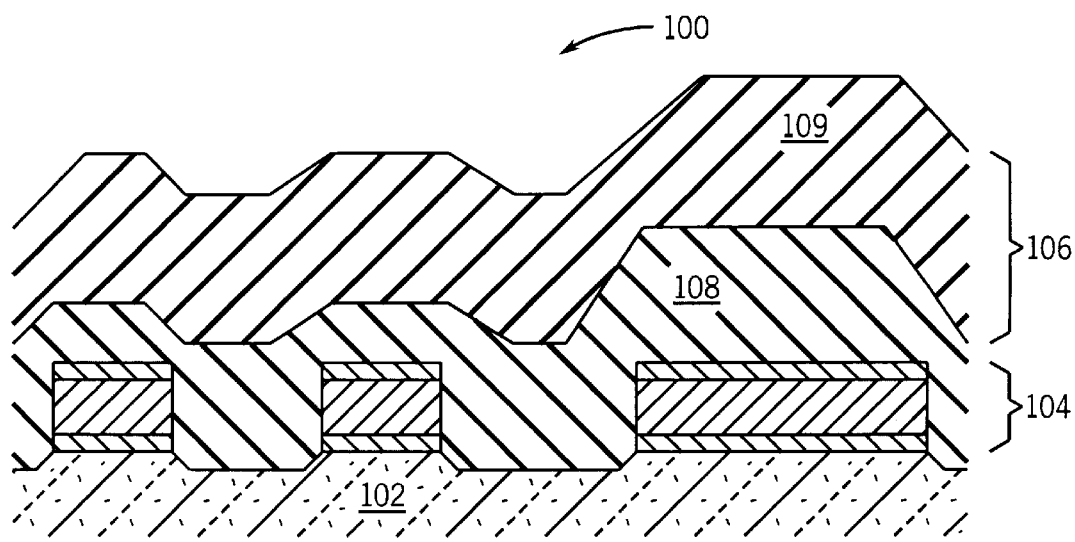
FIG. 7 is a cross-sectional view of an integrated circuit showing a fluorinated silicon dioxide deposition step in accordance with an exemplary embodiment of the process of the present invention.

After layer 64 is deposited, layer 64 is etched to form holes for vias 82. Vias 82 can be a contact or an interlevel connection comprised of aluminum, tungsten, or any of the materials associated with layer 72, 74, or 76. After layer 64 is etched, layer 64 is subjected to an ammonia ($NH_3$) plasma treatment to deplete fluorine at the surface of layer 64 in step 54. Preferably, a top surface 84 (FIG. 6) is depleted by the plasma in step 54 to form a layer or region 94. Additionally, a surface 86 (FIG. 5) within the hole for via 82 is also depleted to form a layer or region 98. Preferably, step 54 depletes fluorine to a distance of 50–80 Å (i.e., regions 98 and 94 have a thickness of 50–80 Å). Step 54 is preferably a PECVD step performed at dual frequencies (e.g., 5 kHz, 13.5 kHz) and with high ion bombardment.

In step 56, surfaces 84 and 86 are passivated by a nitrite ($NO_2^-$) plasma. Step 56 forms region 96 on surface 84 and region 99 on surface 86.

Step 54 is performed in-situ with passivation step 56. Steps 54 and 56 improve the adhesion of layer 72 of metal layer 66 to layer 64 and the adhesion of metal fill material in via 82 to layer 64. Regions 96 and 99 extend a distance of 20–25 Å below surfaces 84 and 86, respectively. After layer 64 is passivated, layer 72 of metal layer 66 is deposited.

With references to FIGS. 7–13, a process of forming an integrated circuit 100 in accordance with yet another exemplary embodiment of the present invention is described. Integrated circuit 100 includes a substrate layer 102, a first metal layer or stack 104, and an interlayer dielectric 106. Stack 104 is 4400–13,000 Å thick and comprised of layers similar to layer 72, 74, and 76 (FIG. 4).

Interlayer dielectric 106 is comprised of a first fluorinated silicon dioxide layer 108 and a second fluorinated silicon dioxide layer 109. Fluorinated silicon dioxide layers 108 and 109 have a dielectric constant between 3.5 and 3.7. Preferably, the combination of layers 108 and 109 have a thickness of 2.4 times the thickness of metal stack 104.

Alternatively, layer 106 can be made of a single layer 108 of fluorinated silicon dioxide. In a single layer embodiment, a gap-filled fluorinated silicon dioxide deposition is utilized. A high etch/depth (HDP) ratio with high bias power is utilized to form vias, as described below. Preferably, in this embodiment, the thickness of layer 108 is 1.2 times the thickness of stack 104.

Figure 8:
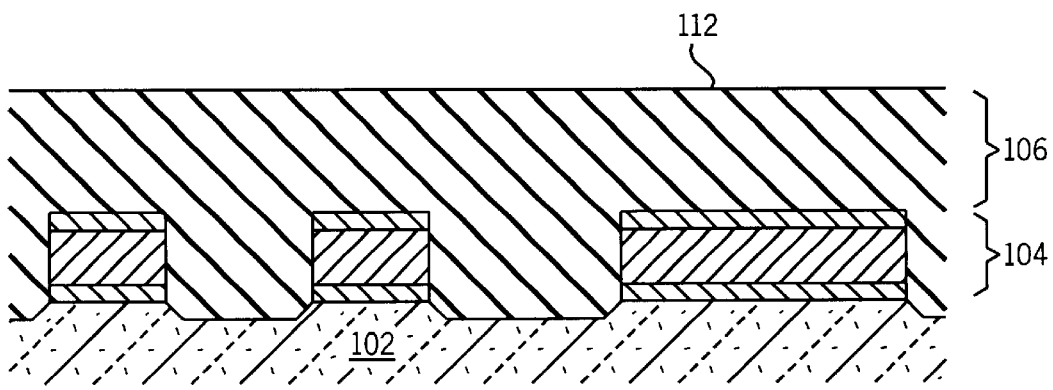
FIG. 8 is a cross-sectional view of the integrated circuit illustrated in FIG. 7, showing a chemical mechanical planarization step in accordance with an exemplary embodiment of the process of the present invention.
Figure 9:
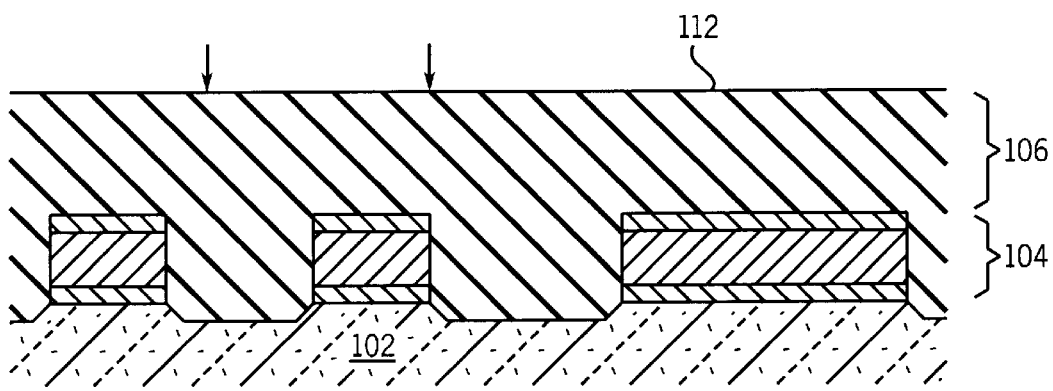
FIG. 9 is a cross-sectional view of the integrated circuit illustrated in FIG. 8, showing a surface treatment step in accordance with an exemplary embodiment of the process of the present invention.

With reference to FIG. 8, layer 106 is subject to a chemical mechanical polish (CMP) and a cleaning treatment. After the cleaning treatment, an ammonia surface treatment is performed to remove fluorine from a top surface 112 of region 106. With reference to FIG. 9, surface 112 is depleted in a similar manner as surface 84, discussed with reference to FIG. 6. Preferably, surface 112 is subjected to an ammonia ($NH_3$) plasma. After fluorine is depleted from surface 112, surface 112 is subject to a passivation step similar to surface 64, discussed with reference to FIG. 4, by utilizing a nitrite ($NO_2^-$) plasma.

Figure 10:
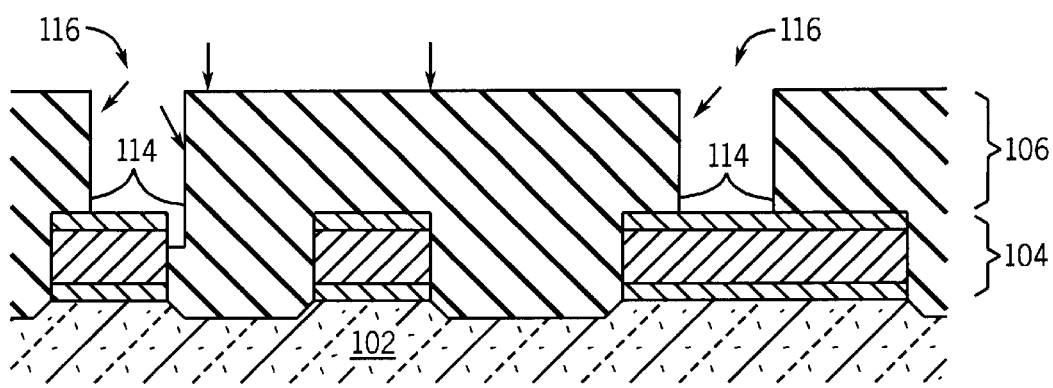
FIG. 10 is cross-sectional view of the integrated circuit illustrated in FIG. 9, showing a contact mask and etch step in accordance with an exemplary embodiment of the process of the present invention.

In FIG. 10, layer 106 is masked and etched to form holes for vias or contacts. After masking and etching, surfaces 114 are subject to depletion and passivation steps similar to the treatments, described with reference to FIG. 9. Surfaces 114 are similar to surface 96, discussed with reference to FIG. 6.

Figure 11:
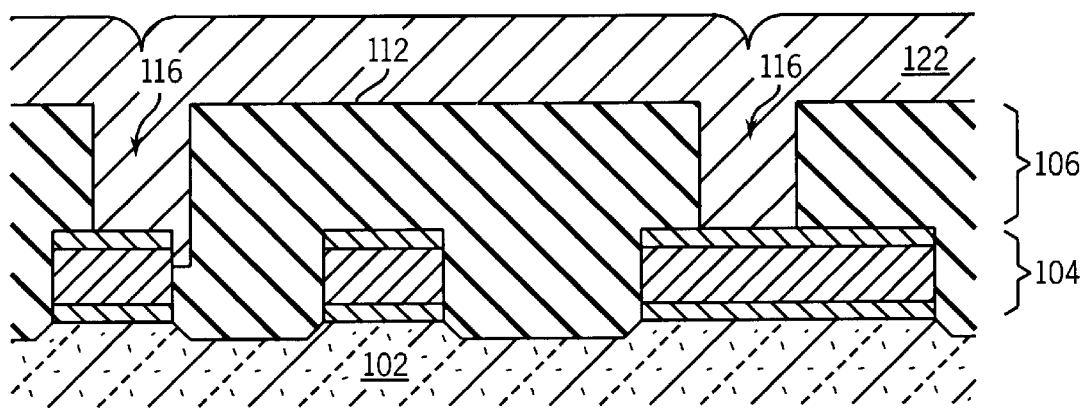
FIG. 11 is a cross-sectional view of the integrated circuit illustrated in FIG. 10, showing a tungsten deposition step in accordance with an exemplary embodiment of the process of the present invention.
Figure 12:
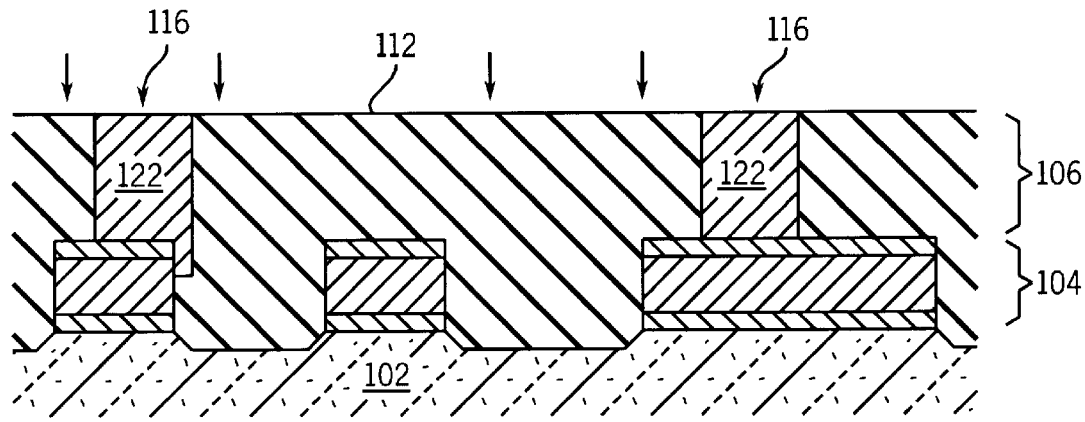
FIG. 12 is cross-sectional view of the integrated circuit illustrated in FIG. 11, showing a tungsten chemical mechanical polish and surface treatment step in accordance with an exemplary embodiment of the process of the present invention.

With reference to FIG. 11, apertures 116 are filled with a metal, such as, a conformal layer 122 of tungsten. Conformal layer 122 is subject to a CMP. The CMP can effect the treatment on surface 112.

Figure 13:
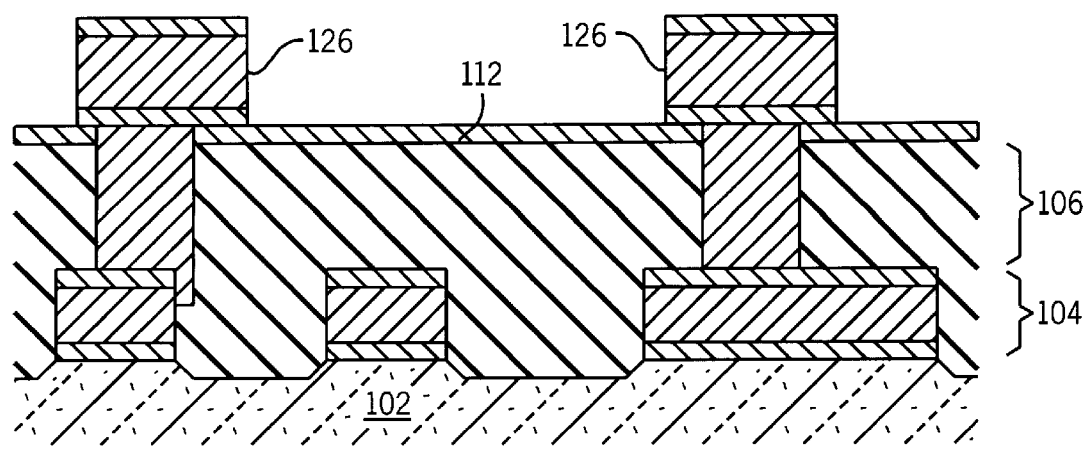
FIG. 13 is a cross-sectional view of the integrated circuit illustrated in FIG. 12, showing a metal layer deposition step in accordance with an exemplary embodiment of the process of the present invention.

With reference to FIG. 12, surface 112 is again subjected to the depletion and passivation treatment, discussed with reference to FIG. 8, to remove the effects of the CMP treatment. With reference to FIG. 13, a second metal layer 126 is deposited over surface 112. The second metal layer 126 can be masked and etched.

It should be noted that although the present invention is particularly advantageous when used to form an SiOF inter-metal dielectric layer, it has application in any situation where the fluorine atoms in an SiOF layer are causing interaction and/or adhesion problems with other layers. The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and their practical application to enable one skilled in the art to utilize the invention in various embodiments and with various modifications as are suited to the particular use contemplated. It is intended that the scope of the invention be defined by the claims appended hereto and their equivalents.

We claim:

1. An integrated circuit, comprising:
   a first conductive layer;
   a second conductive layer; and
   an insulative layer serving to insulate the first and second conductive layers including fluorinated silicon dioxide, the insulative layer having a surface in contact with the second conductive layer, the surface being depleted of fluorine to a first depth and passivated to a second depth, wherein the second depth is less than the first depth, wherein the surface is treated by one of (1) depletion by a process including ammonia, and (2) passivation by a process including nitrite.

2. The integrated circuit of claim 1, wherein the surface is depleted by a process including ammonia, and the surface is passivated in a process including nitrite.

3. The integrated circuit of claim 1, wherein the first and second conductive layers are composite layers including at least one metal layer.

4. The integrated circuit of claim 1, wherein the fluorinated silicon dioxide has a dielectric constant of less than 3.8.

5. The integrated circuit of claim 1, wherein the first depth is between about 50 and 80 Å.

6. The integrated circuit of claim 1, wherein the second depth is less than about 25 Å.

7. The integrated circuit of claim 1, wherein the surface is a top surface of the insulative layer.

8. The integrated circuit of claim 1, wherein the surface is a surface for a via.

9. The integrated circuit of claim 3, wherein the metal layer comprises aluminum, tantalum, copper, or titanium.

10. An integrated circuit, comprising:
    a first metal stack;
    a second metal stack; and
    a fluorinated silicon dioxide material disposed between the first metal stack and the second metal stack, the material having a surface, the surface being depleted by a process including ammonia and the surface being passivated in a process including nitrite, whereby delamination from the material is reduced.

11. The integrated circuit of claim 10, wherein the surface is a top surface in contact with the second metal stack.

12. The integrated circuit of claim 10, wherein the first and second metal stacks include aluminum, tantalum, copper, or titanium.

13. The integrated circuit of claim 10, wherein the surface is depleted to a depth between 50 and 80 Å.

14. The integrated circuit of claim 10, wherein the surface is passivated to a depth less than 25 Å.

15. The integrated circuit of claim 10, wherein the surface is a surface for a via.

16. A semiconductor chip comprising:
    an integrated circuit with at least a first layer and a second layer, and with a dielectric layer of SiOF disposed between the first layer and the second layer, wherein the dielectric layer has a surface depleted of fluorine, the layer being depleted in an ammonia process, wherein the surface is passivated with nitrite.

17. A semiconductor chip comprising:
    an integrated circuit with at least a first layer and a second layer, and with a dielectric layer of SiOF disposed between the first layer and the second layer, wherein the dielectric layer has a surface depleted of fluorine, the layer being depleted in an ammonia process wherein the first and second layers are metallic layers.

18. The semiconductor chip as recited in claim 17, wherein the surface is passivated with nitrite.

19. The semiconductor chip as recited in claim 17, wherein the second layer is adjacent to the fluorine-depleted region and is comprised of TiN.

20. An integrated circuit with at least a first layer and a second layer, and with a dielectric layer of SiOF disposed between the first layer and the second layer, wherein the dielectric layer has a surface depleted of fluorine, the layer being depleted in an ammonia process wherein the flourine depletion surface has a depth of between 50 and 70 Å.

* * * * *